(12) United States Patent
Chou

(10) Patent No.: US 6,714,152 B1
(45) Date of Patent: Mar. 30, 2004

(54) PIPELINED ANALOG-TO-DIGITAL CONVERTER

(75) Inventor: Kuo-Yu Chou, Hsinchu (TW)

(73) Assignee: Novatek Microelectronics Co., Hsinchu (TW)

( * ) Notice: Subject to any disclaimer, the term of this patent is extended or adjusted under 35 U.S.C. 154(b) by 0 days.

(21) Appl. No.: 10/369,642

(22) Filed: Feb. 21, 2003

(30) Foreign Application Priority Data

Dec. 27, 2002 (TW) ..................................... 91137773 A

(51) Int. Cl.[7] ................................................ H03M 1/34
(52) U.S. Cl. ........................ 341/162; 341/155; 341/161; 341/156
(58) Field of Search ................................ 341/155, 161, 341/162, 156

(56) References Cited

U.S. PATENT DOCUMENTS

| | | | | |
|---|---|---|---|---|
| 3,577,139 A | * | 5/1971 | Foerster ...................... 341/162 |
| 4,769,628 A | * | 9/1988 | Hellerman .................. 341/162 |
| 5,157,395 A | * | 10/1992 | Del Signore et al. ....... 341/143 |
| 5,579,007 A | * | 11/1996 | Paul ............................ 341/162 |
| 5,754,134 A | * | 5/1998 | Shou et al. ................. 341/162 |
| 6,232,899 B1 | * | 5/2001 | Craven ........................ 341/155 |
| 6,366,230 B1 | * | 4/2002 | Zhang et al. ................ 341/162 |
| 6,515,611 B1 | * | 2/2003 | Fetterman et al. .......... 341/162 |

* cited by examiner

Primary Examiner—Michael Tokar
Assistant Examiner—Lam Mai
(74) Attorney, Agent, or Firm—Troxell Law Office PLLC

(57) ABSTRACT

The present invention is a pipelined analog-to-digital converter (Pipelined ADC) for converting a first analog signal to a digital data. The converter comprises at least one first stage circuit, at least one second stage circuit, a third stage circuit, and a code adder. Each of the first stage circuits has a first converting rate for converting a first analog signal to at least one digital code and generating a second analog signal. The second stage circuits are serially connected after the first stage circuit. Each of the second stage circuits has a second converting rate which is higher than the first converting rate for converting the second analog signal to at least two digital codes and generating a third analog signal. The third stage circuit serially connected after the second stage circuits is used for converting the third analog signal to at least one digital code. The code adder is used for combining the digital codes to generate the digital data. Thus, the later half stage circuits of the Pipelined ADC has a higher converting rate, so the converter of the present invention can reduce the number of the stage circuits needed and further reduces the area of the converter.

14 Claims, 5 Drawing Sheets

PIPELINED ANALOG-TO-DIGITAL CONVERTER

BACKGROUND OF THE INVENTION

1. Field of the Invention

This present invention relates to a Pipelined Analog-to-Digital Converter, especially to a Pipelined Analog-to-Digital Converter comprising two different stage circuits. These two stage circuits have different converting rates.

2. Description of the Prior Art

Please refer to FIG. 1 and FIG. 2. FIG. 1 is a configuration schematic diagram of a conventional Pipelined Analog-to-Digital Converter. FIG. 2 is a schematic diagram of the working time sequence of a stage circuit in a conventional Pipelined Analog-to-Digital Converter. A conventional pipelined analog-to-digital converter 10 comprises a plurality of stage circuits Si (i=1~n), a register 15 and a digital output code integrating device 17. Each conventional stage circuit Si comprises a sample-and-hold 12, a comparator 14, an amplifier 16 and a compensation filament 18. The process that the conventional stage circuits Si converts an analog input signal to a digital data output can be divided into two modes which are the sampling mode and the amplifying mode.

The principle of how the pipelined analog-to-digital converter 10 work is as below: when an outside analog signal $V_{in}$ is input into the first stage circuit $S_1$ of the Pipelined Analog-to-Digital Converter 10, the first stage circuit $S_1$ first enters the sampling mode. That is, the sample-and-hold 12 samples and holds the analog signal $V_{in}$, and then compares the analog signal $V_{in}$ with a reference signal $V_{ref}$ set in advance in the comparator 14 to acquire a digital output code. After finishing these actions, enter the amplifying mode. In the amplifying mode, the amplifier 16 amplifies the analog signal $V_{in}$. Then according to the digital output code acquired by the comparator 14, the compensation filament 18 increases a compensation value to the amplified analog signal, and transmits the amplified analog signal to the second stage circuit $S_2$.

Later stage circuits repeat the actions aforesaid, but the last stage circuit $S_n$ without amplifying, only proceeds the sampling mode and the level judgment. The digital output codes output by each of the stage circuits will temporarily store in the register 15. When the last stage circuit $S_n$ outputs a digital output code, a digital output code integrating device 17 integrates all the digital output codes to get a digital data $B_{out}$ corresponding to the analog signal $V_{in}$.

Wherein, the resolution k of each stage circuit is decided by the number of the reference signal of the comparator. If the resolution of each stage is one bit, the reference signal is usually $\pm V_{ref}/4$. When the resolution of a stage circuit is determined, the amplified multiple G of the amplifier of the stage circuit will also be determined. The relation is $G=2^k$.

Because each stage circuit comprises a sample-and-hold 12, each stage circuit can work at the same time. For example, when a second stage circuit outputs an analog signal to a third stage circuit, the second stage starts to deal with the analog signal in the sample-and-hold input by the first stage circuit. Therefore, except the latency in the very beginning, the pipelined analog-to-digital converter resembles a flash analog-to-digital converter, which can output a convert outcome in every clock period.

If the configuration of the resolution in each stage circuit is 1 bit, a shortcoming of the pipeline analog-to-digital converter is that a lot of stage circuits are necessary, so that the number of amplifiers needs to increase. A ten bits pipeline analog-to-digital converter has to adopt nine stages. Therefore, need nineteen comparators and eight amplifiers. The more amplifiers, the more power wasted. However, if improve the resolution of stages, the power required in the amplifier and the comparator of each stage circuit has to increase, and the power totally wasted by the pipeline analog-to-digital converter cannot be decreased greatly, either. Therefore, a new stage circuit configuration is necessary to effectively decrease the power totally wasted by the pipeline analog-to-digital converter.

U.S. Pat. No. 6,195,032 is for solving this phenomenon. The patent uses a recycle method to combine two stage circuits as a block in which signals repeat converting, in order to improve that one stage circuit only performs one calculation for an analog signal. That is, after converted by two stage circuits in one block, the analog signal is not output to the next stage circuit, but is repeated converting several times inside the block. Thereby, a configuration, which originally needs N stage circuits, now can decrease to need only two stage circuits to repeat calculating. Or combine several blocks, so that the analog signal can be repeated calculating in one block several times to meet the purpose to decrease the number of stage circuits. However, when applying the method of U.S. Pat. No. 6,195,032, it is necessary to raise the converting rate of a stage circuit more than one time. Therefore, although applying U.S. Pat. No. 6,195,032 can decrease the area occupied and the latency caused by the converter, it can also let the requirement of the unit gain bandwidth of the amplifier in the stage circuit be raised more than one time. This phenomenon will cause the pipeline analog-to-digital converter, which applies U.S. Pat. No. 6,195,032 cannot be applied in high rate calculating.

SUMMARY OF THE INVENTION

An objective of the invention is to provide a pipeline analog-to-digital converter to solve the problem of the prior art.

Another objective of the invention is to provide a pipeline analog-to-digital converter with fewer elements, which can effectively decrease the number of amplifiers to obviously decrease the power totally wasted by the converter.

Another objective of the invention is to provide a pipeline analog-to-digital converter, which decreases the stage circuits; therefore the area occupied by the whole converter can be reduced.

This invention relates to a pipeline analog-to-digital converter for converting a first analog signal to a digital data. The converter comprises a group of first stage circuits, a group of second stage circuits, a third stage circuit and a digital output code integrating device.

The group of first stage circuits converts the first analog signal to at least one digital output code, and outputs a second analog signal. The group of first stage circuits comprises at least one first stage circuit. Each of the first stage circuits has a first converting rate, in order to convert the analog signal inputted into the first stage circuit to a digital output code in one clock.

The group of second stage circuits series- connects after said group of first stage circuits. The group of second stage circuits converts the second analog signal to at least two digital output codes, and generates a third analog signal. The group of second stage circuits comprises at least one second stage circuit. Each of the second stage circuits has a second converting rate which is higher than the first converting rate, so as to output at least two digital output codes per clock.

The third stage circuit series connects after the group of second stage circuits, used for converting the third analog signal to at least one digital output code. The digital output code integrating device integrates the digital output codes converted by the group of first stage circuits, the group of second stage circuits, and the third stage circuit to generate the digital data.

Thereby, the stage circuits in the back of the pipeline analog-to-digital converter have a higher converting rate, which can convert the analog signal to more than two digital output codes in one clock. Therefore, in contrast to a conventional pipeline analog-to-digital converter with the same resolution, the pipeline analog-to-digital converter of the present invention can reduce the number of the stage circuits needed, and further reduce the area occupied by the whole converter. The pipeline analog-to-digital converter of this invention increases only the converting rate of the back stage circuit; therefore the requirement of the elements of the back stage circuit will not be higher than the front circuit. Thus the pipeline analog-to-digital converter of the present invention could meet the demand of high rate application.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 3:
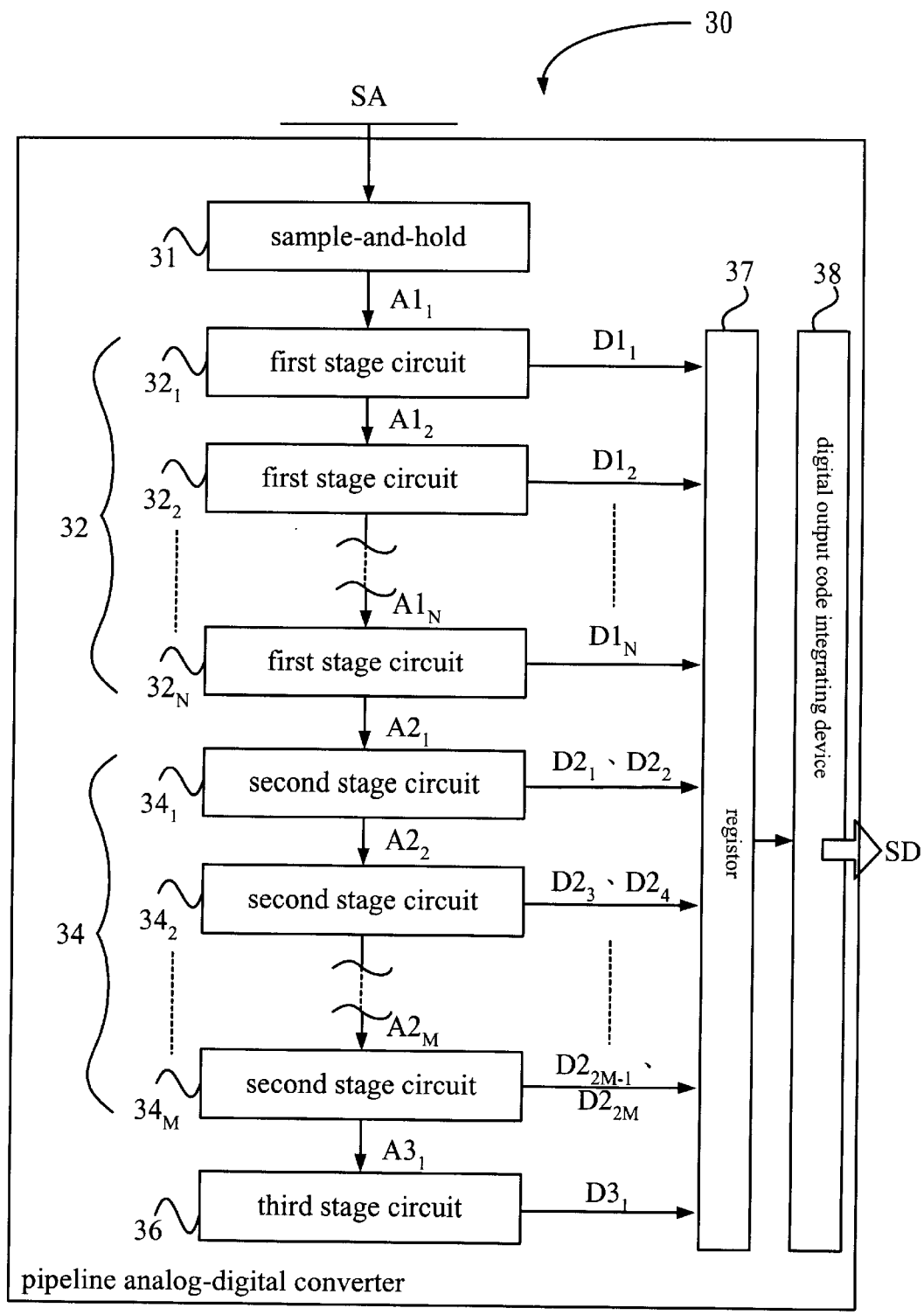
FIG. 3 is a schematic diagram of the first embodiment of this invention.

Referring to FIG. 3, FIG. 3 is a schematic diagram of the first embodiment of this invention. This invention provides a pipeline analog-to-digital converter 30 to convert an analog signal SA to a digital SD. The converter 30 comprises a sample-and-hold 31, a group of first stage circuits 32, a group of second stage circuits 34, a third stage circuits 36, a register 37 and a digital output code integrating device 38.

The group of first stage circuits 32 converts the first analog signal SA to at least one digital output code $D1_i$, and outputs a second analog signal $A2_1$. The group of first stage circuits 32 comprises at least one first stage circuit $32_i$ (i=1~N). Each first stage circuit $32_i$ has a first converting rate, in order to convert the analog signal $A1_i$ (i=1~N) input into each first stage circuit $32i$ to a digital output code $D1_i$ (i=1~N) in one clock.

As shown in FIG. 3, when the analog signal SA is input into the converter 30, the sample-and-hold circuit 31 samples and holds the analog signal SA to wait for that the stage circuit series connected after the sample-and-hold circuit 31 proceeds the conversion for the analog signal SA. When receiving the analog signal $A1_1$ from the sample-and-hold 31, the frontest first stage circuit $32_1$ of the group of first stage circuits 32 converts the analog signal $A1_1$ right away and generates a digital output code $D1_1$ according to the converting rate and the resolution of the first stage circuit. Then transmit the processed analog signal $A1_1$ to the later first stage circuit $32_2$. The analog signal $A1_1$ and the analog signal SA are actually the same signal. In order to conveniently explain, different symbols are added.

As shown in FIG. 3, the first stage circuit $32_2$ proceeds the same converting process for the analog signal $A1_2$ processed by the frontest first stage circuit $32_1$ to acquire an output digital $D1_2$. Then output the analog signal $A1_3$ which is processed twice to the next first stage circuit $32_3$ (not shown in FIG. 3). Continue the action aforesaid until the last first stage circuit $32_N$ processes the first analog signal $A1_N$ which is processed N−1 times. N digital output codes and one analog signal $A2_1$ are generated.

One point is emphasized here. That is, in the group of the first stage circuits 32, as the converted time of the analog signal SA increases, the requirement of elements in the back first stage circuit is smaller than the requirement of objects in the front first stage circuit. In order to conveniently explain, all the stage circuits with the same converting rate are called the first stage circuits.

As shown in FIG. 3, the group of second stage circuits 34 series connects after the group of first stage circuits 32. The group of second stage circuits 34 is used for converting the analog signal $A2_1$ to at least two digital output codes $D2_j$ (j=1~2M), and generating an analog signal $A3_1$. The group of second stage circuits 34 comprises at least one second stage circuit $34_j$ (j=1~M). Each of the second stage circuits $34_j$ has a second converting rate higher than the first converting rate, so as to convert the analog signal inputted in every second stage circuit $34_j$ (j=1~M) to at least two digital output codes $D2_j$ (j=1~2M) per clock.

Figure 1:
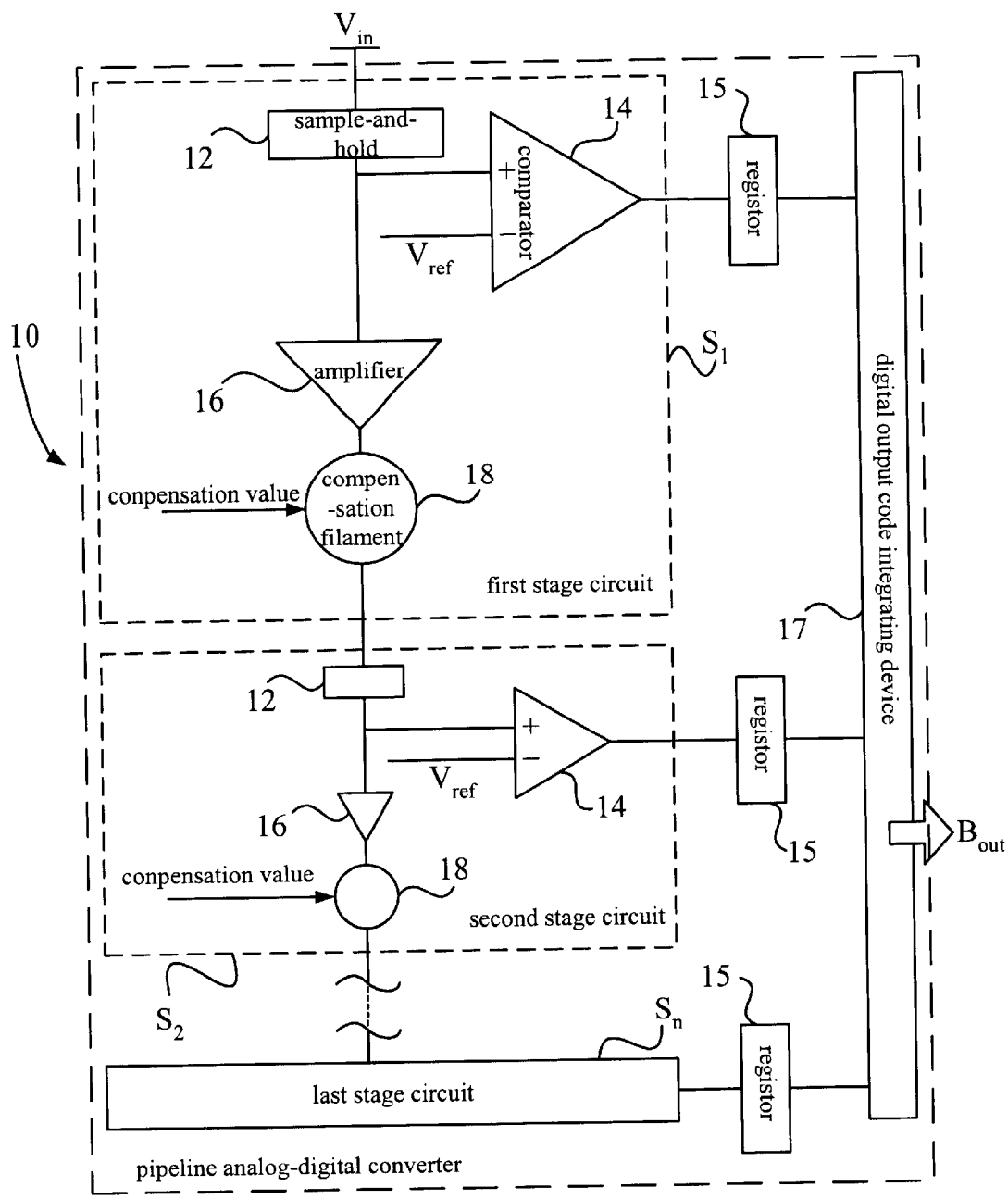
FIG. 1 is a configuration schematic diagram of a conventional Pipelined Analog-to-Digital Converter.
Figure 2:
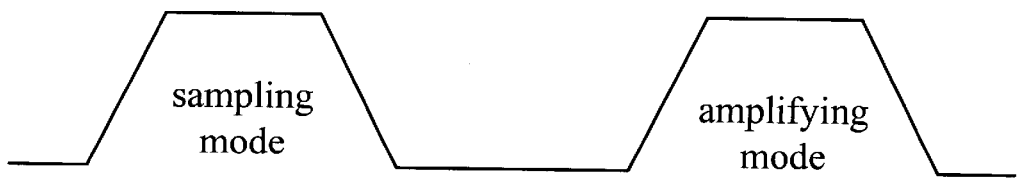
FIG. 2 is a schematic diagram of the working time sequence of a stage circuit in a conventional Pipelined Analog-to-Digital Converter.
Figure 4:
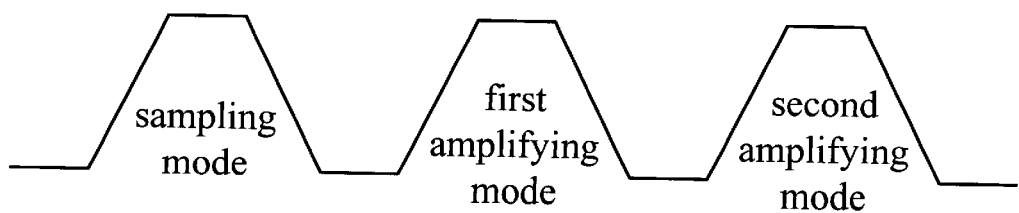
FIG. 4 is a schematic diagram of the working time sequence of the second stage circuit in FIG. 3.

Please refer to FIG. 4. FIG. 4 is a schematic diagram of the working time sequence of the second stage circuit $34j$ in FIG. 3. As mentioned in the background, the first stage circuit proceeds the sampling mode and the amplifying mode to generate an output code. However, the second stage circuit of this invention applies its higher converting rate and proceeds a sampling mode, a first amplifying mode and a second amplifying mode in the same clock as the first stage circuit. Because the second stage circuit proceeds an action of converting signal in the sampling mode and the first amplifying mode, each second stage circuit $34_j$ can generate two digital output codes, and then the second amplifying mode generates the converted analog signal transmitted to the next second stage circuit or the third stage circuit. The first embodiment of this invention proceeds three modes in one clock. Compared with the first stage circuit, which proceeds two modes in one clock, it is known that the second converting rate is 1.5 times of the first converting rate.

As shown in FIG. 3, when receiving the analog signal $A2_1$ from the first stage circuit $32_N$, the second stage circuit $34_1$ which is the frontest one of the group of the second stage circuits 34 converts the first analog signal $A2_1$ according to the converting rate and the resolution of the second stage circuit. Derive two digital output codes $D2_1$ and $D2_2$ in one clock, and transmit the processed analog signal $A2_2$ to the later second stage circuit $34_2$.

As shown in FIG. 3, the second stage circuit $34_2$ proceeds the same converting process to the analog signal $A2_2$ which is processed by the frontest second stage circuit $34_1$ to acquire two digital output codes $D2_3$ and $D2_4$. Output the processed analog signal $A2_3$ to the next second stage circuit $34_3$ (not shown in FIG. 3). Continue the action aforesaid until the last second stage circuit $34_M$ processes the analog signal $A2_M$. Totally 2M digital output codes and one analog signal $A3_1$ are generated.

The third stage circuit 36 series connects after the group of second stage circuits $34_M$. The third stage circuit 36 is used for converting the third analog signal $A3_1$ to a digital output code $D3_1$. Because the third stage circuit 36 is the last stage circuit of the pipeline analog-to-digital converter 30, it comprises only one sample-and-hold circuit and one comparator, but no amplifier. As mentioned in the background, the third stage circuit 36 only proceeds the conversion of the sampling mode and generates a digital output code $D3_1$.

The register 37 is used for temporarily storing the digital output codes generated in every clock by the group of first stage circuits 32, the group of second stage circuits 34, and the third stage circuit 36, so the pipeline analog-to-digital converter 30 can output in every clock a converting outcome for one analog signal.

The digital output code integrating device 38 is used for integrating N digital output codes generated by the group of first stage circuits 32, 2M digital output codes generated by the group of second stage circuits 34, and the digital output code $D3_1$ generated by the third stage circuit 36. The digital output code integrating device 38 then generates the digital data SD.

To sum up, this invention is a pipeline analog-to-digital converter, which the internal stage circuit has several kinds of converting rate. The reason to make this design is when the converter is applied in high converting rate, the converting rate of all stage circuits of the converter cannot be raised directly to reduce the area occupied and the power wasted by the converter. Therefore, the first embodiment of this invention only reasonably increases the converting rate of stage circuits by 0.5 times, in order that the converter reduces its area and power even in a high converting rate.

Figure 5:
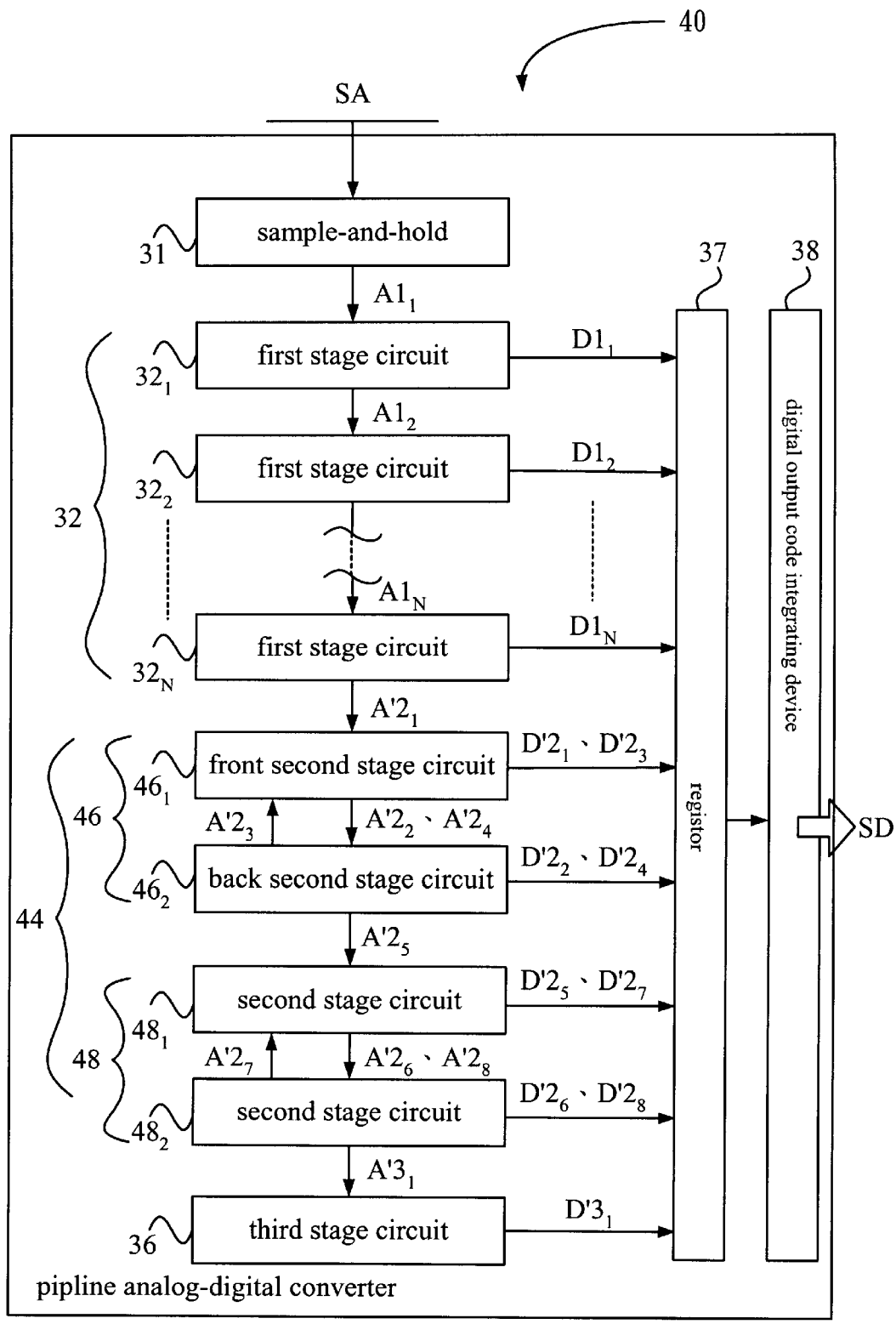
FIG. 5 is a schematic diagram of the second embodiment of this invention.

Please refer to FIG. 5. FIG. 5 is a schematic diagram of the second embodiment of this invention. The pipeline analog-to-digital converter 40 mentioned in the second embodiment comprises a sample-and-hold circuit 31, a group of first stage circuits 32, a group of second stage circuits 44, a third stage circuits 36, a register 37 and a digital output code integrating device 38. In the second embodiment, the method to operate the sample-and-hold circuit 31, the group of first stage circuits 32, the third stage circuits 36, the register 37 and the digital output code integrating device 38 is the same as the first embodiment. Here need not repeat.

The group of second stage circuits 44 comprises at least one set of second stage circuits. Each set of second stage circuits comprises two second stage circuits, which are divided into a front second stage circuit and a back second stage circuit. To conveniently explain, FIG. 5 shows only two sets of second stage circuits 46, 48 to explain.

As shown in FIG. 5, after the group of first stage circuits 32 generates an analog signal $A'2_1$, the front second stage circuit $46_1$ of the first set of second stage circuits 46 will convert the analog $A'2_1$ according to the converting rate and the resolution of the second stage circuit. Then generate a digital output code $D'2_1$ and a processed analog signal $A'2_2$ to transmit to the back second stage circuit $46_2$. The back second stage circuit $46_2$ then converts the analog signal $A'2_2$ to a digital output code $D'2_2$ and a processed analog signal $A'2_3$. The analog signal $A'2_3$ is not transmitted to the next set of second stage circuits 48, but recycled to the front second stage circuit $46_1$. In the second embodiment of this invention, the first set of second stage circuits 46 proceeds the same converting process to the analog signal $A'2_3$ as to the analog signal $A'2_1$ and generates two digital output codes $D'2_3$, $D'2_4$ and an analog signal $A'2_5$ to transmit to the second set of second stage circuits 48. The second set of second stage circuits 48 proceeds the same recycle method to convert to four digital output codes $D'2_5$, $D'2_6$, $D'2_7$, $D'2_8$ and an analog signal $A'3_1$ and transmits them to the third stage circuit 36.

As the mentioned above, the sets of second stage circuits 46, 48 use the recycle method to generate four digital output codes in every two clocks. In other words, the second converting rate of each second stage circuit has to be twice of the first converting rate, so as to proceed two conversions for the analog signal per one clock, and then generate two digital output codes. However, it is known for the people familiar with this art that each set of second stage circuits can execute the recycle several times to output more digital output codes, but the converting rate has to be increased at the same time.

Figure 6:
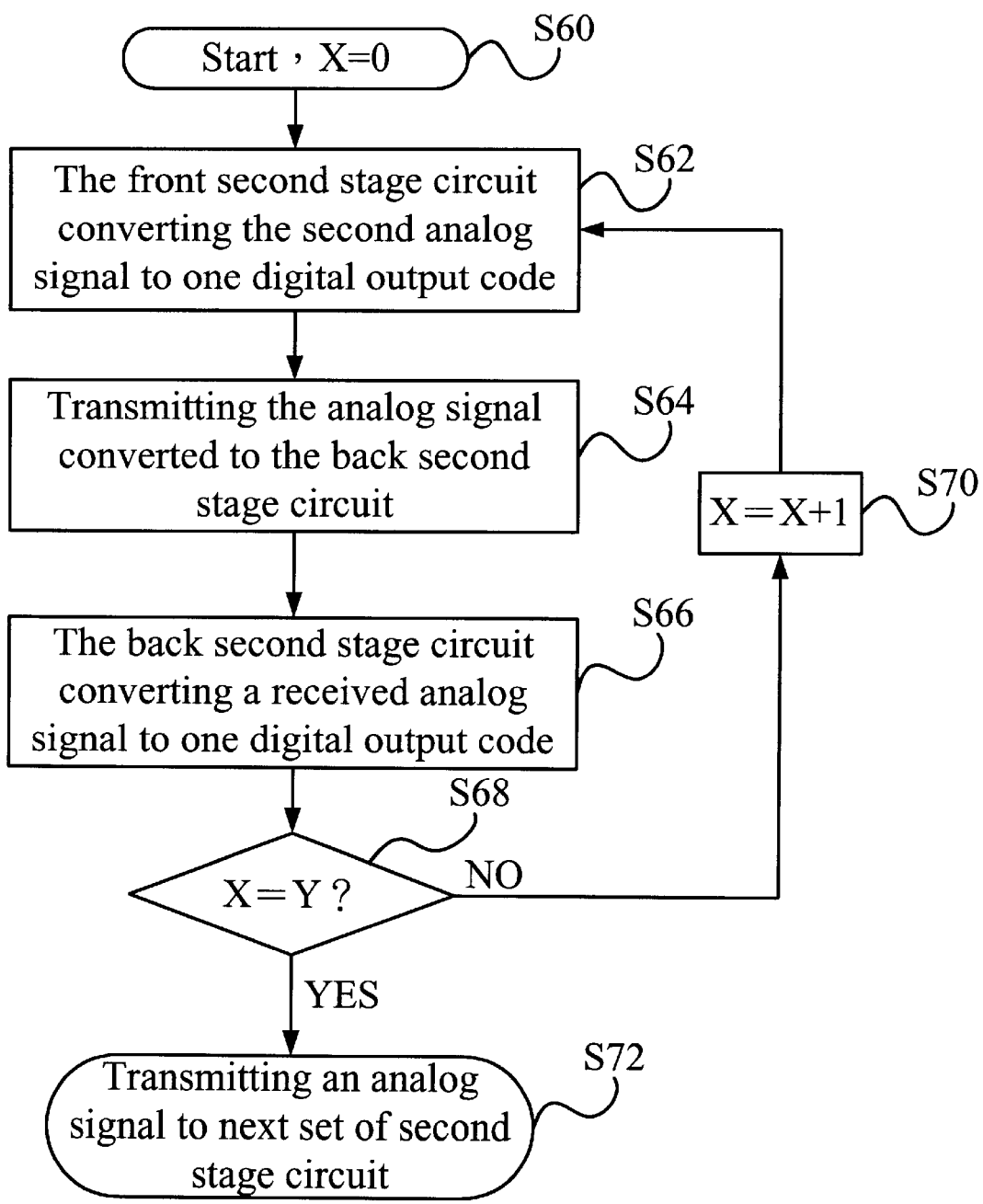
FIG. 6 is flowchart of the recycle method applied in the group of second stage circuits in FIG. 5.

Please refer to FIG. 6. FIG. 6 is flowchart of the recycle method applied in the group of second stage circuits in FIG. 5. The recycle method comprises following steps:

Step S60: receiving the analog signal, recycle time X=0;

Step S62: The front second stage circuit $46_1$ converting the second analog signal to one digital output code in the second converting rate;

Step S64: Transmitting the analog signal which is converted to the back second stage circuit $46_2$;

Step S66: The back second stage circuit $46_2$ converting a received analog signal to one digital output code;

Step S68: determining whether the recycle time X equals to the predetermined times Y. If not, proceeding Step S70; if yes, proceeding Step S72.

Step S70: recycle to Step S62, X=X+1.

Step S72: Transmitting an analog signal A to the next set of second stage circuits 48.

Now describe the detail of timing to apply this invention. By the equation below, this invention can determine when to increase the converting rate of the internal stage circuit of the converter:

$$e^{-T/\tau} < \frac{1}{2^{N-M}}, \tau = \frac{1}{2\pi \cdot GBW \cdot f}$$

Wherein T is the clock period (operation time), N is the resolution of the pipeline analog-digital converter, M is the resolution of the comparator, GBW is the unit-gain bandwidth of the amplifier of the stage circuit, and f is the feedback value of the amplifier.

Please refer to Table 1. Table 1 is the requirement data sheet of the third embodiment of this invention. The third embodiment of this invention is a pipeline analog-digital converter with a resolution of 9 digits, and the resolution of each stage circuit is 1.5 digits. Table 1 lists the requirement of gain and the unit-gain bandwidth. The requirement of the amplifier of the first stage circuit is the lower limit in design. Therefore, according to the data of Table 1, if increase the converting rate of the first stage circuit, the design of the whole converter cannot be performed. The third embodiment of this invention increases the converting rate of the sixth stage circuit, to let the sixth stage circuit proceed the double calculation as the first embodiment or the recycle method as the second embodiment, and thus the seventh stage circuit can be neglected. As a result, the number of the stage circuits in the whole converter can be reduced and further reduces the area occupied and the power wasted. What to emphasize is the data in Table 1 just increase the converting rate twice. For people who are familiar with this art, it is known that the converting rate can be increase several times to meet the requirement of the converter. However, this modification should not beyond the range of this invention.

TABLE 1

| Circuit Name | Converting rate × 1 | | Converting rate × 2 | |
|---|---|---|---|---|
| | Amplifier Gain Requirement (DB) | Unit-Gain Bandwidth (Mhz) | Amplifier Gain Requirement (DB) | Unit-Gain Bandwidth (Mhz) |
| Sample-and-hold circuit | 66 | 88 | 66 | 88 |
| The 1st stage | 63.5 | 119 | 63.5 | 238 |
| The 2nd stage | 57.5 | 105 | 57.5 | 210 |
| The 3rd stage | 51.5 | 91.8 | 51.5 | 183.6 |
| The 4th stage | 45.5 | 78.7 | 45.5 | 157.4 |
| The 5th stage | 39.5 | 65.58 | 39.5 | 131.16 |
| The 6th stage | 33.5 | 52.46 | 33.5 | 104.92 |
| The 7th stage | 27.5 | 39.34 | 27.5 | 78.68 |
| The 8th stage | 21.5 | 26.22 | 21.5 | 52.44 |

To convenient understand the first embodiment and the third embodiment of this invention, the first embodiment and the third embodiment can be generalized as below. The stage circuits including from the first stage circuit to the fifth stage circuit in the third embodiment correspond to the first stage circuit mentioned in the first embodiment. The sixth stage circuit in the third embodiment corresponds to the second stage circuit in the first embodiment. The seventh stage circuit in the third embodiment corresponds to the third stage circuit in the first embodiment.

Briefly speaking, when applying this invention, a user evaluates only the design limit of an amplifier and the requirement of amplifiers including in every stage circuit, and then can proceed the designing of a converter. Increase the converting rate of the back stage circuit of the converter, to reduce the whole area occupied and power wasted by the converter.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A Pipelined Analog-to-Digital Converter (Pipelined ADC) for converting a first analog signal to a digital data, said converter comprising:

A group of first stage circuits for converting said first analog signal to at least one digital output code and generating a second analog signal, said group of first stage circuits comprising at least one first stage circuit, each of said first stage circuits having a first converting rate, so as to output one digital output code in one clock;

A group of second stage circuits series connecting after said group of first stage circuits, used for converting said second analog signal to at least two digital output codes, and generating a third analog signal, said group of second stage circuits comprising at least one second stage circuit, each of said second stage circuits having a second converting rate which is higher than said first converting rate, so as to output average at least two digital output codes in one clock;

A third stage circuit series connecting after said group of second stage circuits, used for converting said third analog signal to at least one digital output code; and A digital output code integrating device, used for integrating said digital output codes converted by said group of first stage circuits, said group of second stage circuits, and said third stage circuit.

2. The converter of claim 1, wherein each of said second stage circuits uses a double operation to convert inputted analog signal twice in said second converting rate to acquire two digital output codes in every clock.

3. The converter of claim 2, wherein said second converting rate is 1.5 times of said first converting rate.

4. The converter of claim 1, wherein said group of second stage circuits is combined every two said second stage circuit as a set of second stage circuits, said set of second stage circuits are divided into a front second stage circuit and a back second stage circuit.

5. The converter of claim 4, wherein each of said set of second stage circuits uses a recycle method to produce four digital output codes in every two clocks.

6. The converter of claim 5, wherein said recycle method comprises following steps:

Said front second stage circuit converting said second analog signal to one digital output code in said second converting rate, and transmitting a second analog signal which is converted once to said back second stage circuit;

Said back second stage circuit converting said second analog signal which is converted once to one digital output code and transmitting a second analog signal which is converted twice back to said front second stage circuit;

Said front second stage circuit converting said second analog signal which is converted twice to one digital output code in said second converting rate, and transmitting a second analog signal which is converted three times to said back second stage circuit;

Said back second stage circuit converting said second analog signal which is converted three times to one digital output code and transmitting a second analog signal which is converted four times to next group of second stage circuit.

7. The converter of claim 6, wherein said second converting rate is twice of said first converting rate.

8. A Pipelined Analog-to-Digital Converter (Pipelined ADC) used for converting a first analog signal to a digital data, said converter comprising:

N first stage circuits, wherein N is a natural number, each of said N first stage circuits having a first converting rate to convert said first analog signal to N digital output codes, and generating a second analog signal;

M second stage circuits series connecting after said first stage circuits, wherein M is a natural number, each of said M second stage circuits having a second converting rate which is higher than said first converting rate to convert said second analog signal to at least 2M digital output codes, and generating a third analog signal;

- A third stage circuit series connecting after said second stage circuits, used for converting said third analog signal to at least one digital output code; and
- A digital output codes integrating device, used for integrating said digital output codes converted by said first stage circuits, said second stage circuits, and said third stage circuit.

9. The converter of claim 8, wherein each of said second stage circuits uses a double operation to convert inputted analog signals twice in said second converting rate to acquire two digital output codes in every clock.

10. The converter of claim 9, wherein said second converting rate is 1.5 times of said first converting rate.

11. The converter of claim 8, wherein said M second stage circuits are combined every two said second stage circuits as a set of second stage circuits, said set of second stage circuits are divided into a front second stage circuit and a back second stage circuit.

12. The converter of claim 11, wherein each of said set of second stage circuits uses a recycle method to produce four digital output codes in every two clocks.

13. The converter of claim 11, wherein said recycle method comprises following steps:

- Said front second stage circuit converting said second analog signal to one digital output code in said second converting rate, and transmitting a second analog signal which is converted once to said back second stage circuit;
- Said back second stage circuit converting said second analog signal which is converted once to one digital output code and transmitting a second analog signal which is converted twice back to said front second stage circuit;
- Said front second stage circuit converting said second analog signal which is converted twice to one digital output code in said second converting rate, and transmitting a second analog signal which is converted three times to said back second stage circuit;
- Said back second stage circuit converting said second analog signal which is converted three times to a digital output code and transmitting a second analog signal which is converted four times to next set of second stage circuit.

14. The converter of claim 13, wherein said second converting rate is twice of said first converting rate.

* * * * *